(12) United States Patent
Zhang (10) Patent No.: US 12,033,709 B2
(45) Date of Patent: Jul. 9, 2024

(54) TEST CIRCUIT AND TEST METHOD THEREOF

(71) Applicant: CHANGXIN MEMORY TECHNOLOGIES, INC., Anhui (CN)

(72) Inventor: Liang Zhang, Shanghai (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 255 days.

(21) Appl. No.: 17/467,570

(22) Filed: Sep. 7, 2021

(65) Prior Publication Data

US 2022/0068419 A1 Mar. 3, 2022

Related U.S. Application Data

(63) Continuation of application No. PCT/CN2021/100759, filed on Jun. 18, 2021.

(30) Foreign Application Priority Data

Aug. 31, 2020 (CN) .......................... 202010893028.8

(51) Int. Cl.
G11C 29/14 (2006.01)
G11C 29/12 (2006.01)
(Continued)

(52) U.S. Cl.
CPC ........ G11C 29/14 (2013.01); G11C 29/12015 (2013.01); H04B 17/0085 (2013.01); H03K 3/037 (2013.01)

(58) Field of Classification Search
CPC . G11C 29/14; G11C 29/12015; G11C 29/023; G11C 29/56016; H04B 17/0085; H03K 3/037
See application file for complete search history.

(56) References Cited

U.S. PATENT DOCUMENTS 3,312,894 A 4/1967 Blake
4,890,270 A 12/1989 Griffith
(Continued)

FOREIGN PATENT DOCUMENTS

CN 101349717 A 1/2009
CN 101410720 A 4/2009
(Continued)

OTHER PUBLICATIONS

First Office Action of the Chinese application No. 202010893028.8, dated May 27, 2023. 8 pages with English translation.
(Continued)

*Primary Examiner* — April Y Blair
*Assistant Examiner* — Rong Tang
(74) *Attorney, Agent, or Firm* — Kilpatrick Townsend & Stockton LLP (57) ABSTRACT

Provided are a test circuit, a test device and a test method thereof. The test circuit includes: a signal processing module configured to receive a pulse signal to be tested and output a processing signal under a control signal; a sampling module connected to the output terminal of signal processing module and configured to receive the processing signal and generate a sampling signal according to the processing signal. The sampling signal includes a first sampling pulse and a second sampling pulse, the first sampling pulse and the second sampling pulse have a pulse width difference, the pulse width difference is equal to the pulse width of the pulse signal.

4 Claims, 7 Drawing Sheets

(51) Int. Cl.
*H04B 17/00* (2015.01)
*H03K 3/037* (2006.01)

(56) References Cited

U.S. PATENT DOCUMENTS

| | | | |
|---|---|---|---|
| 5,083,299 A | | 1/1992 | Schwanke |
| 6,366,611 B1 | | 4/2002 | Park |
| 6,446,249 B1 | * | 9/2002 | Wang .................... G06F 30/331 |
| | | | 326/38 |
| 6,710,637 B1 | | 3/2004 | Chan |
| 7,496,137 B2 | * | 2/2009 | Ichiyama ......... G01R 31/31709 |
| | | | 702/69 |
| 8,874,999 B1 | * | 10/2014 | Taylor ................... H03L 7/1976 |
| | | | 714/775 |
| 2007/0244656 A1 | | 10/2007 | Cranford, Jr. |
| 2010/0277214 A1 | * | 11/2010 | Chang .................... H03K 5/04 |
| | | | 327/175 |
| 2020/0052681 A1 | * | 2/2020 | Tung .................... H03K 5/1565 |

FOREIGN PATENT DOCUMENTS

| | | | | |
|---|---|---|---|---|
| CN | 102136803 A | * | 7/2011 | ............ H02M 5/458 |
| CN | 102136803 A | | 7/2011 | |
| CN | 102928677 A | | 2/2013 | |
| CN | 103176059 A | | 6/2013 | |
| CN | 103809025 A | | 5/2014 | |
| CN | 108267628 A | | 7/2018 | |
| JP | H07280857 A | | 10/1995 | |
| JP | H11220367 A | | 8/1999 | |
| JP | 2011153971 A | | 8/2011 | |

OTHER PUBLICATIONS

First Office Action of the Japanese application No. 2022-550121, dated Sep. 26, 2023, 11 pages with English translation.

* cited by examiner

TEST CIRCUIT AND TEST METHOD THEREOF

CROSS-REFERENCE TO RELATED APPLICATIONS

This application is continuation of International application No. PCT/CN2021/100759, filed on Jun. 18, 2021, which claims the priority to Chinese patent application No. 202010893028.8, filed on Aug. 31, 2020 and entitled "Test Circuit, Test Device and Test Method thereof". The contents of International application No. PCT/CN2021/100759 and Chinese patent application No. 202010893028.8 are incorporated herein by reference in their entireties.

TECHNICAL FIELD

The embodiments of the present application relate to the technical field of memory, and in particular, to a test circuit, a test device and a test method thereof.

BACKGROUND

A memory is a device used to store data. The memory usually includes multiple storage arrays, and each storage array includes multiple storage units. Each storage unit, as the basic unit structure of data storage, has the function of data storage.

When reading and writing the memory, it needs to be controlled by a pulse signal. Exemplarily, a pulse signal may be used to control the on and off of a transistor pair connected to the word line. Specifically, when the pulse signal is valid, the storage unit performs a read or write operation, and when the pulse signal becomes invalid, the storage unit maintains the original data. With the continuous increase in the requirements for the read and write speed of the memory, it is necessary to further increase the transmission frequency of the pulse signal and reduce the pulse width. In order to ensure the reliability of the pulse signal, it is necessary to test the pulse width through a test circuit to ensure that the generated pulse signal is the same as the designed signal. However, with the continuous narrowing of the pulse width, higher requirements are put forward for the test circuit and test device for a pulse width, and the present test circuit can no longer accurately test the narrowing pulse width.

SUMMARY

In an aspect of this application, a test circuit is provided, which includes a signal processing module and a sampling module.

The signal processing module is used to receive a pulse signal to be tested and output a processing signal under the control of a control signal.

The sampling module is connected to an output terminal of the signal processing module, and is used to receive the processing signal and generate a sampling signal according to the processing signal.

The sampling signal includes a first sampling pulse and a second sampling pulse, the first sampling pulse and the second sampling pulse have a pulse width difference, and the pulse width difference is equal to a pulse width of the pulse signal.

In another aspect of the present application, a testing device is provided, which includes the test circuit as described above, and an analysis module.

The analysis module is connected to the sampling module and is used to obtain the pulse width of the pulse signal according to the first sampling pulse and the second sampling pulse.

In another aspect of the present application, a test method is provided, which is based on the above-mentioned test device and includes the following operations.

A pulse signal to be tested is received.

A processing signal is output under the control of a control signal.

A sampling signal is generated according to the processing signal, the sampling signal including a first sampling pulse and a second sampling pulse.

The pulse width of the pulse signal is obtained according to the first sampling pulse and the second sampling pulse.

The first sampling pulse and the second sampling pulse have a pulse width difference, and the pulse width difference is equal to the pulse width of the pulse signal.

BRIEF DESCRIPTION OF THE DRAWINGS

In order to better describe and illustrate the embodiments of the application, one or more drawings may be referred to. However, the additional details or examples used to describe the drawings should not be considered as the limitation on the scope of any of the disclosure, the currently described embodiments or implementation modes of the present application.

DETAILED DESCRIPTION

In order to facilitate understanding of the embodiments of the present application, the embodiments of the present application will be described in a more comprehensive manner with reference to related drawings. Some embodiments of the present application are shown in the accompanying drawings. However, the embodiments of the present application can be implemented in many different forms and are not limited to the embodiments described herein. On the contrary, these embodiments are provided to make the disclosure of the embodiments of the present application more thorough and comprehensive.

Unless otherwise defined, all technical and scientific terms used herein have the same meaning as commonly understood by those skilled in the technical field belonging to the embodiments of the present application. The terms used in the description of the embodiments of the present application herein are only for the purpose of describing specific embodiments, and are not intended to limit the embodiments of the present application. The term "and/or" as may be used herein includes any and all combinations of one or more related listed items.

In the description of the embodiments of the present application, it needs to be understood that the terms "upper", "lower", "vertical", "horizontal", "inner", "outer", etc., are based on the method or positional relationship shown in the drawings, are only for convenience of describing the embodiments of the present application and simplifying the description, rather than indicating or implying that pointed device or element must have a specific orientation, be constructed and operated in a specific orientation, and therefore cannot be understood as the limitation to the embodiments of the present application.

Figure 1:
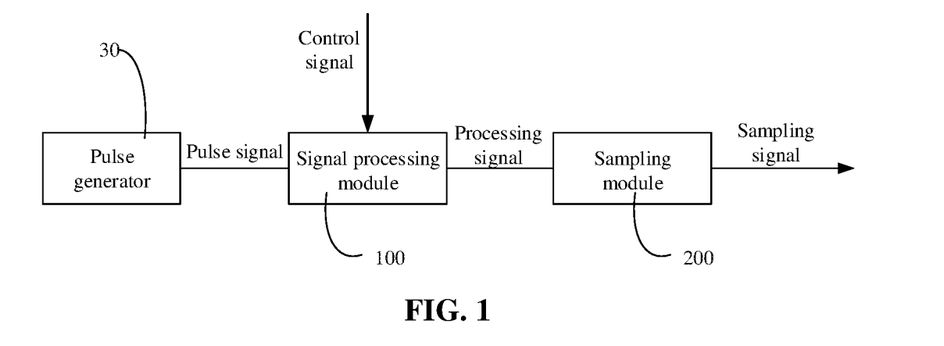
FIG. 1 is a schematic structural diagram of a test circuit of a first embodiment.

FIG. 1 is schematic structural diagram of a test circuit 10 of a first embodiment. Referring to FIG. 1, in this embodiment, the test circuit 10 includes a signal processing module 100 and a sampling module 200.

A pulse signal to be tested is generated by a pulse generator 30 and is divided into at least two channels: one pulse signal is transmitted to the test circuit 10 for testing, and the other pulse signal is transmitted to the storage array to control data reading and writing of the storage array. In the embodiment of the present application, the pulse signal includes multiple pulses, and the pulse width refers to the duration of the high level of each pulse, that is, the time interval between the rising edge time and the falling edge time of a pulse is the pulse width.

The signal processing module 100 is used to receive a pulse signal to be tested, and output a processing signal under the control of the control signal, and the processing signal is the pulse signal or the inverted pulse signal in time division.

The processing signal is the pulse signal or the inverted pulse signal in time division means that the waveform of the processing signal coincides with the waveform of the pulse signal during part of the time period of the processing signal, and the waveform of the processing signal coincides with the waveform of the inverted pulse signal during the remaining time period of the processing signal. In this embodiment, the processing signal is transmitted to the clock driving terminal of the sampling module 200 to serve as the clock for the sampling of the signal input by the sampling module 200. Specifically, the signal input by the sampling module 200 is sampled according to edges of the processing signal.

It can be understood that one sampling module 200 usually only samples at one type of edge, that is, only rising edges or only falling edges. Therefore, if the sampling module 200 is required to sample at different edges, multiple triggers and other structures with complex structure need to be provided in the sampling module 200, which will result in more complex internal structure and control circuit of the sampling module 200. In this embodiment, by controlling the processing signal to be a pulse signal or an inverted pulse signal in time division, the sampling module 200 may only sample at one type of edges, that is, the pulse signal is inverted to achieve sampling at different edges. Exemplarily, if the sampling module 200 performs sampling at the rising edges, and part of the edges of the sampling signal is generated based on the falling edges of the pulse signal, a target falling edge of the pulse signal may be inverted to convert the falling edge of the pulse signal into the rising edge of the processing signal, simple and accurate sampling of the sampling module 200 can be implemented, thereby simplifying the internal structure of the sampling module 200. Moreover, compared with the sampling module 200 with a structure of multiple triggers, the control logic and circuit required for implementation of the time-divisional control of the inverting function are simpler. Therefore, the signal processing module 100 of this embodiment further simplifies the overall test circuit structure of the test circuit 10.

The sampling module 200 is connected to the output terminal of the signal processing module 100, and is used to receive the processing signal and generate a sampling signal according to the processing signal. The sampling signal includes a first sampling pulse and a second sampling pulse. The first sampling pulse and the second sampling pulse have a pulse width difference. The pulse width difference is equal to the pulse width of the pulse signal. The pulse width difference refers to the difference between the pulse width of the first sampling pulse and the pulse width of the second sampling pulse, and the sampling module 200 generates a sampling signal in response to edges of the processing signal. Therefore, each rising edge in the sampling signal and each falling edge corresponds to an edge in the processing signal, that is, each rising edge and each falling edge in the sampling signal also corresponds to an edge in the pulse signal.

In this embodiment, the test circuit 10 includes a signal processing module 100 and a sampling module 200. The signal processing module is used to receive a pulse signal to be tested and output the processing signal under the control of a control signal, and the processing signal is the pulse signal or the inverted pulse signal in time division. The sampling module 200 is connected to the output terminal of the signal processing module 100, and is used to receive the processing signal and generate a sampling signal according to the processing signal. The sampling signal includes a first sampling pulse and a second sampling pulse, the first sampling pulse and the second sampling pulse have a pulse width difference, and the pulse width difference is equal to the pulse width of the pulse signal. In this embodiment, the input pulse signal is processed by the signal processing module 100, and the sampling module 200 with a simpler structure may be used to sample at different edges of the pulse signal, thereby simplifying the hardware structure of the test circuit 10 and further samples the processing signal by means of the sampling module 200 to generate the first sampling pulse and the second sampling pulse, and the pulse width may be obtained through the first sampling pulse and the second sampling pulse, that is, a test circuit 10 with higher test accuracy is realized.

Figure 2:
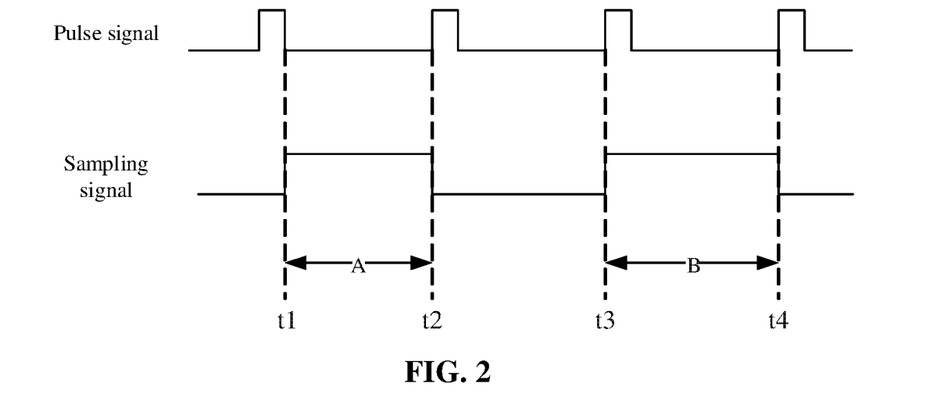
FIG. 2 is an exemplary signal sequence diagram corresponding to the embodiment of FIG. 1.

In some embodiments, the sampling module 200 may be used to generate the first sampling pulse in response to the different edges of the first two pulses at time sequence, and to generate the second sampling pulse in response to the same edge of the last two pulses at time sequence. FIG. 2 is an exemplary signal sequence diagram corresponding to the embodiment of FIG. 1. Referring to FIG. 1, in this embodiment, the pulse signal includes four pulses, and the sampling module 200 generates a corresponding edge in responds to one of the rising edge and the falling edge of each pulse. Specifically, the first rising edge of the sampling signal is generated in response to the falling edge of the first pulse, the first falling edge of the sampling signal is generated in response to the rising edge of the second pulse, the second rising edge of the sampling signal is generated in response to the rising edge of the third pulse, and the second falling edge of the sampling signal is generated in response to the rising edge of the fourth pulse. The time interval between the first rising edge moment t1 and the first falling edge moment t2 is the width A of the first sampling pulse, and the time interval between the second rising edge moment t3 and the second falling edge moment t4 is the width B of the second sampling pulse. Therefore, based on the test circuit 10 of this embodiment, the pulse width of the input pulse signal can be obtained by only sampling one edge of each pulse, thereby reducing the sampling difficulty of the sampling module 200, and thus improving the test accuracy of the test circuit 10.

Figure 3:
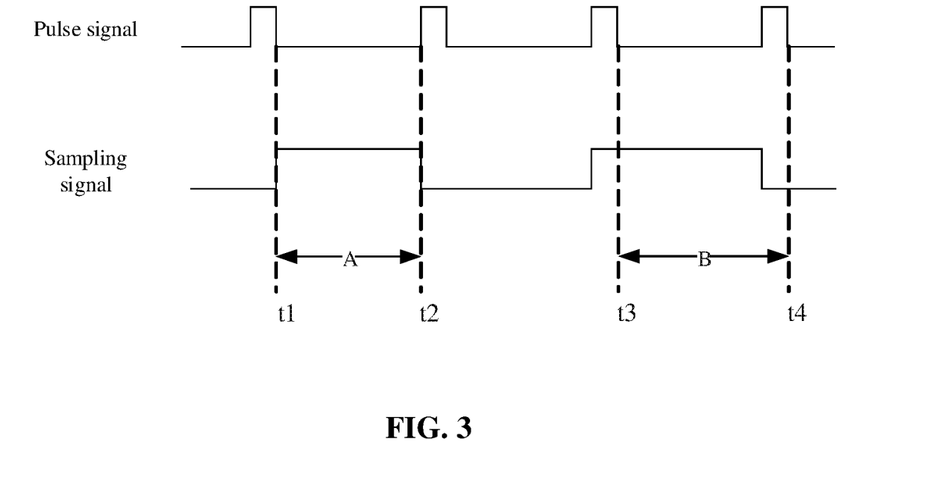
FIG. 3 is another exemplary signal sequence diagram corresponding to the embodiment of FIG. 1.
Figure 4:
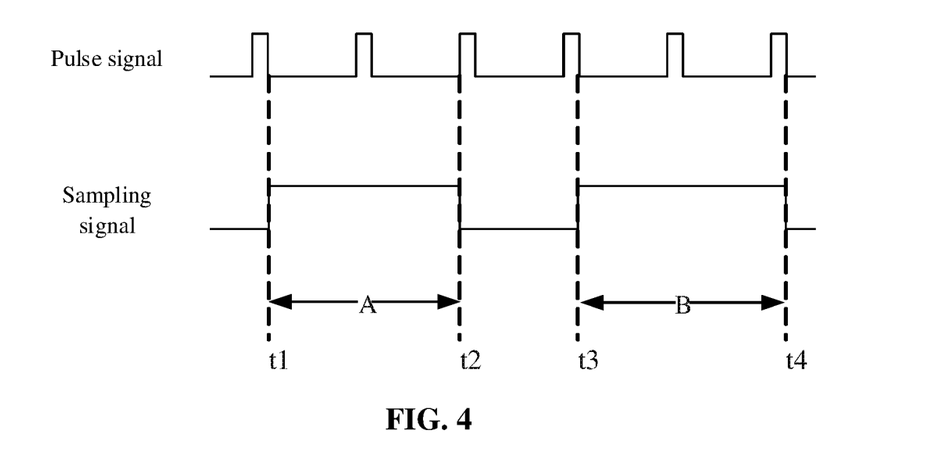
FIG. 4 is yet another exemplary signal sequence diagram corresponding to the embodiment of FIG. 1.

In other embodiments, as shown in FIG. 3, the second sampling pulse may be generated in response to the falling edge of the third pulse and the falling edge of the fourth pulse. Moreover, as shown in FIG. 4, the first sampling pulse may be generated in response to three or more pulses, and the second sampling pulse may be generated in response to other three or more pulses. It is also possible that the pulse signal includes five or more pulses, the first sampling pulse is generated in response to the first pulse and the second pulse, and the second sampling pulse is generated in response to the fourth pulse and the fifth pulse. It should be noted that the sampling signal generation methods in the embodiments of FIGS. 2 to 4 are only used for exemplary description, and are not used to limit the protection scope of the present application, as long as the difference between pulse width of the first sampling pulse and the second sampling pulse is equal to the pulse width of the pulse signal to be tested, it belongs to the protection scope of the present application.

Figure 5:
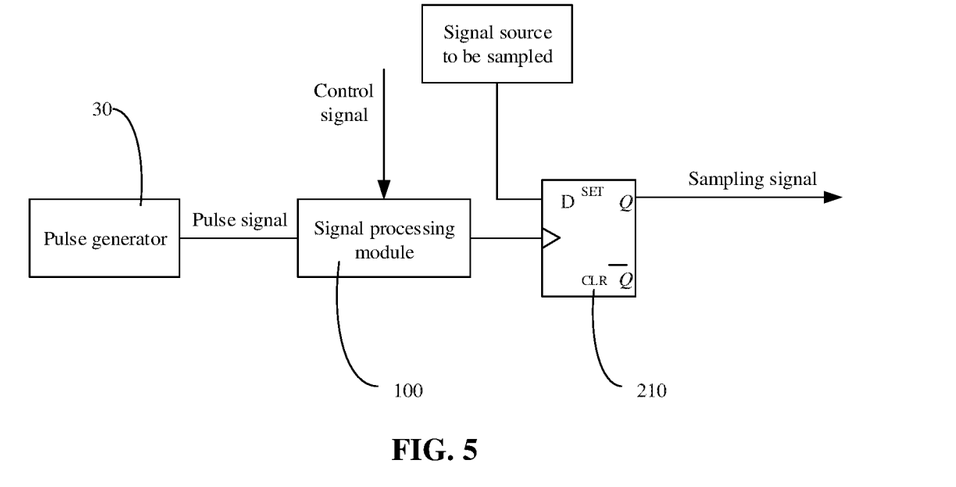
FIG. 5 is a schematic structural diagram of a test circuit of a second embodiment.

FIG. 5 is schematic structural diagram of a test circuit 10 of a second embodiment. Referring to FIG. 5, in this embodiment, the sampling module 200 includes a first temporary storage unit 210. The clock driving terminal of the first temporary storage unit 210 is connected to the signal processing module 100, and the first temporary storage unit 210 is used to sample the signal to be sampled in response to the processing signal to generate a first temporary storage signal, and the edge of the sampling signal corresponds to the edge of the first temporary storage signal. The input terminal of the first temporary storage unit 210 is connected to the signal source to be sampled, and the signal source to be sampled is used to output the signal to be sampled, exemplarily, the signal to be sampled may be a signal that is switched between a high level and a low level at a preset time interval.

Figure 6:
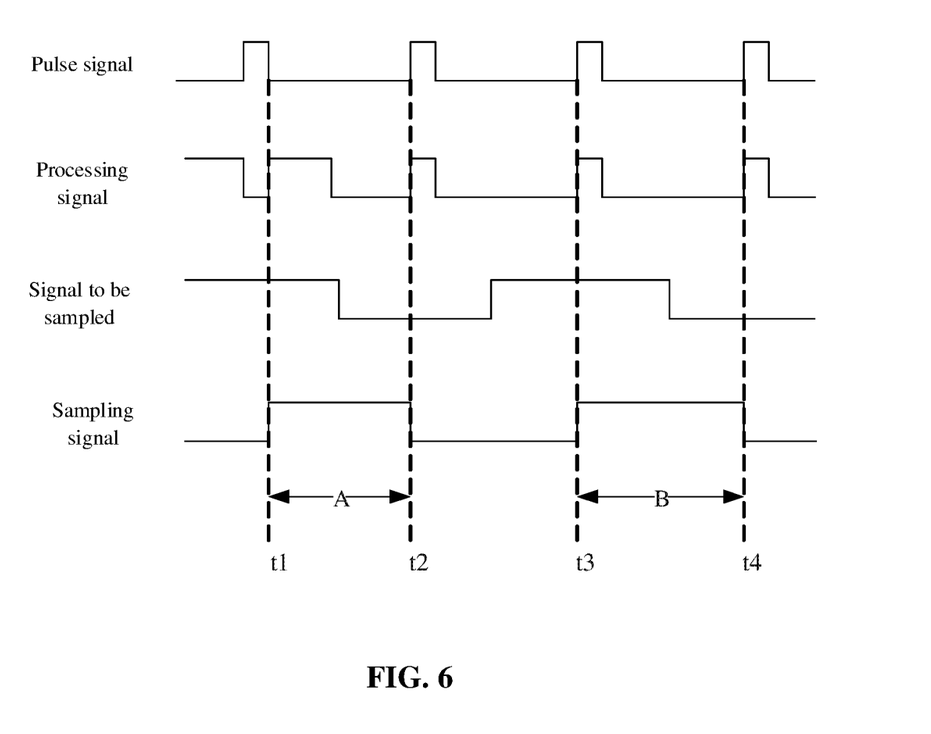
FIG. 6 is an exemplary signal sequence diagram corresponding to the embodiment of FIG. 5.

FIG. 6 is an exemplary signal sequence diagram corresponding to the embodiment of FIG. 5. Referring to FIG. 5, in this embodiment, the pulse signal may include four pulses adjacent in timing sequence. The signal processing module 100 is used to, in response to a control signal, invert the first pulse in the timing sequence in the pulse signal, and not invert the remaining pulses. The sampling module 200 is used to generate the first sampling pulse in response to the first two pulses in timing sequence, and to generate the second sampling pulse in response to the last two pulses in time sequence. Specifically, the period of the signal to be sampled is twice the period of the pulse signal, and the edge of the signal to be sampled is staggered from the edge of the pulse signal, so as to ensure the accuracy of sampling the signal to be sampled according to the edge of the processing signal. It can be understood that accurate sampling can be performed only when the signal to be sampled corresponding to the edge of the processing signal is in a stable state. Therefore, in this embodiment, the test circuit 10 requires a lower time sequence accuracy of the signal to be sampled, that is, the time sequence window is larger, and the time sequence reliability is higher.

Further, the first temporary storage unit 210 includes one or more of a trigger, a latch, and a register. In the embodiment shown in FIGS. 5, 7-8 and 10-11, the first temporary storage unit 210 includes a first D trigger. The clock driving terminal of the first D trigger is connected to the output terminal of the signal processing module 100. The input terminal of the first D trigger is connected to the signal to be sampled, and the signal output from the output terminal of the first D trigger may be used as a sampling signal. Furthermore, the set terminal or the reset terminal of the first D trigger may also be connected to an external circuit, so that the initial state of the first D trigger is determined by setting or resetting, thereby improving the reliability of the test circuit 10. In this embodiment, the first temporary storage unit 210 may sample and latch the edge of the processing signal, so as to accurately and stably output the sampled signal.

Figure 7:
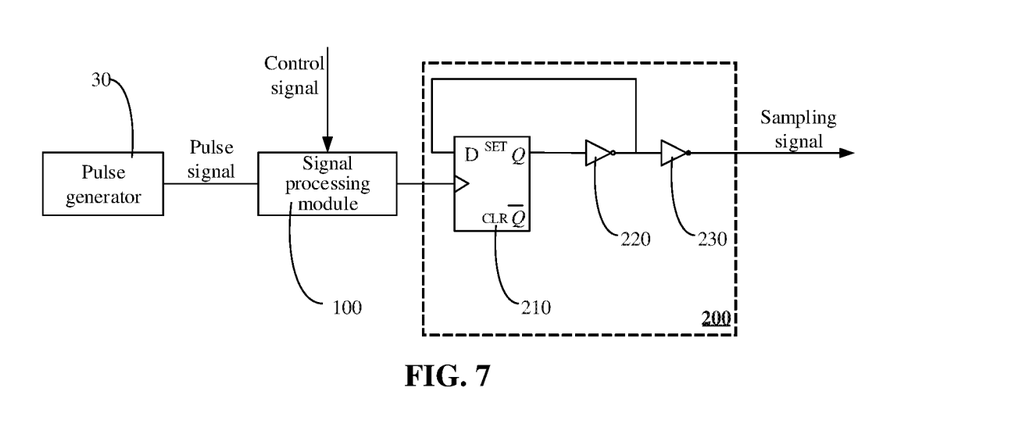
FIG. 7 is a schematic structural diagram of a test circuit of a third embodiment.

FIG. 7 is a schematic structural diagram of a test circuit 10 of a third embodiment. Referring to FIGS. 7-8 and 10-11, in this embodiment, the sampling module 200 thither includes a second inverter 220, which forms a feedback loop together with the first D trigger. The feedback loop is used to generate a feedback signal in response to the processing signal, and the edge of the feedback signal corresponds to the edge of the processing signal. It can be understood that, in the foregoing embodiments, the sampling signal may be output only through the signal source to be sampled from the external device. In this embodiment, by forming a feedback loop, the signal at the input terminal of the first D trigger can follow the feedback signal output by the second inverter 220, thereby simplifying the test circuit 10 and improving the flexibility and reliability of the test circuit 10.

Specifically, the input terminal of the second inverter 220 is connected to the output terminal of the first D trigger, and the output terminal of the second inverter 220 is connected to the input terminal of the first D trigger, and the second inverter 220 is used to invert the first temporal storage signal to generate a feedback signal. Exemplarily after the rising edge of the current processing signal cycle arrives, the first temporary storage signal output by the first D trigger is in the 0 state, and the feedback signal output by the inverted output of the second inverter 220 is in the 1 state, then the signal at the input terminal of the first D trigger is also in the 1 state, after the rising edge of the next processing signal cycle arrives, the first temporary storage signal will switch to the 1 state, thereby automatically updating the feedback signal input from the input terminal of the first D trigger, that is, the test circuit 10 having a simpler structure and capable of automatic sampling is realized.

With continued reference to FIGS. 7-8 and 10-11, in an embodiment, the sampling module 200 further includes a third inverter 230. An input terminal of the third inverter 230 is connected to an output terminal of the second inverter 220. The third inverter 230 is used to receive the feedback signal and generate the sampling signal according to the feedback signal. By setting the third inverter 230, the signal output by the sampling module 200 can coincide with the signal output by the first D trigger.

Figure 8:
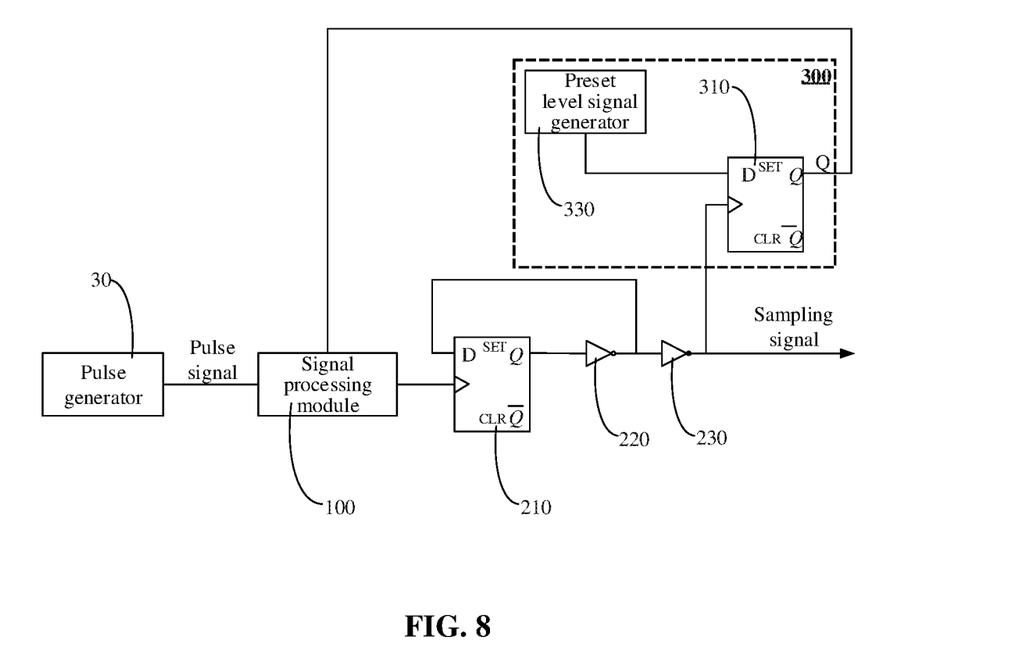
FIG. 8 is a schematic structural diagram of a test circuit of a fourth embodiment.

FIG. 8 is a schematic structural diagram of a test circuit 10 of a fourth embodiment. Referring to FIG. 8, in this embodiment, the test circuit 10 further includes a control module 300, which is connected to the sampling module 200 and the signal processing module 100 respectively, and is used to generate the control signal in response to the sampling signal. The edge of the control signal corresponds to the edge of the sampling signal.

Figure 9:
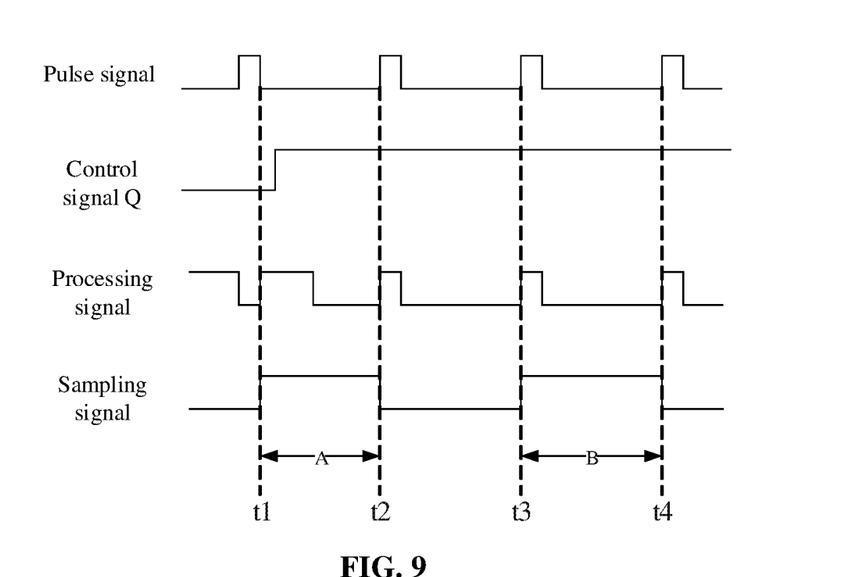
FIG. 9 is an exemplary signal sequence diagram corresponding to the embodiment of FIG. 8.

Specifically, the control module 300 may generate a responsive control signal according to the signal output by the sampling module 200, so as to control the output signal of the signal processing module 100, that is, control the processing signal output by the signal processing module 100 according to the electrical level state of the control signal. For example, FIG. 9 is an exemplary signal sequence diagram corresponding to the embodiment of FIG. 8. Referring to FIG. 9, in this embodiment, when the electrical level state of the control signal is high, the signal processing module 100 outputs a pulse signal; when the electrical level state of the control signal is low, the signal processing module 100 outputs an inverted pulse signal.

Figure 10:
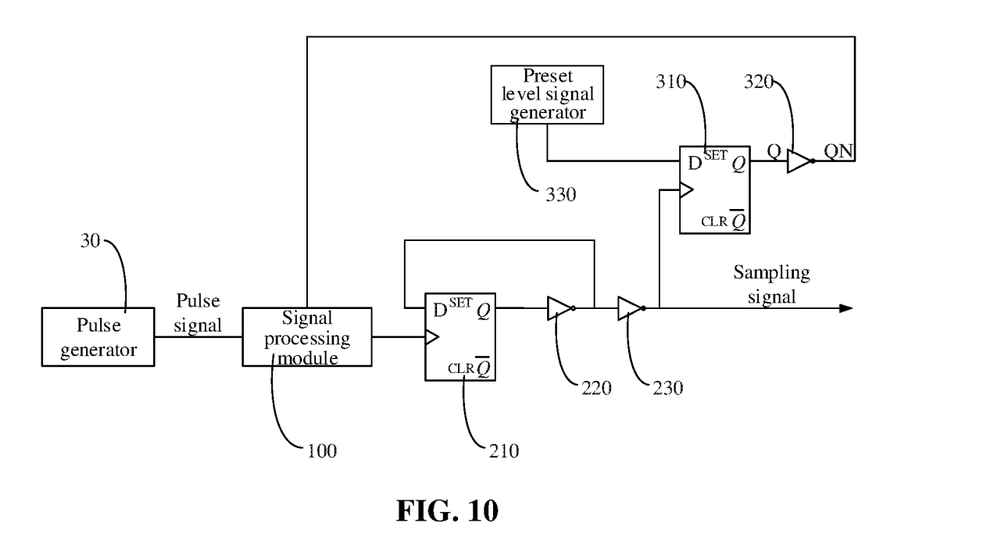
FIG. 10 is a schematic structural diagram of a test circuit of a fifth embodiment.
Figure 11:
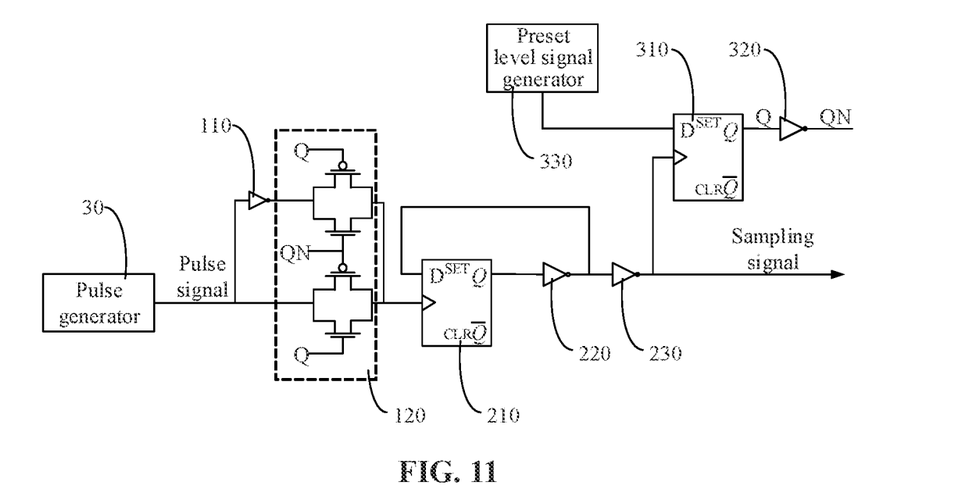
FIG. 11 is a schematic structural diagram of a test circuit of a sixth embodiment.

With continued reference to FIG. 8, the control module 300 may include a second temporary storage unit 310. As shown in FIGS. 8, 10 and 11, the second scratch unit 310 includes the second D trigger. The clock driving terminal of the second D trigger is connected to the output terminal of the sampling module 200, and the input terminal of the second D trigger is connected to a preset level signal generator to obtain a preset level signal, and the output terminal of the second D trigger is connected to the signal processing module 100, and the second D trigger is used to, in response to the sampling signal, sample the preset level signal to generate a second temporary storage signal. The edge of the control signal corresponds to the edge of the second temporary storage signal. That is, the preset level signal generator outputs a signal in a constant level state, for example, a high level signal. Before the sampling module 200 runs, the second D trigger may be reset to make the second D trigger outputs in the 0 state, the enable signal of the reset terminal is disconnected at the target time, and the high level signal output by the preset level signal generator is sampled according to the sampling signal, so that the state of the control signal Q output by the second D trigger is switched to the 1 state, thereby realizing the purpose of inverting part of the pulse signal and keeping the state of the remaining pulse signal. The target moment may be controlled through the number of inverters connected to the output terminal of the first D trigger.

FIG. 10 is a Schematic structural diagram of a teat circuit 10 of a fifth embodiment. Referring to FIGS. 10-11, in this embodiment the control module 300 further includes a fourth inverter 320. The input terminal of the fourth inverter 320 is connected to the output terminal of the second D trigger. The fourth inverter 320 is used to receive the second D trigger and generate the control signal according to the second temporary storage signal. In this embodiment a control signal Q and a control signal QN may be generated bye the fourth inverter 320, that is, the signal processing module 100 may be controlled based on the two control signals, thereby improving the control reliability of the signal processing module 100.

FIG. 11 is a schematic structural diagram of a test circuit 10 of a sixth embodiment. Referring to FIG. 11, in this embodiment, the signal processing module 100 includes a first inverter 110 and a multiplexer 120. The first input terminal of the multiplexer 120 is connected to the output terminal of the first inverter 110. The second input terminal of the multiplexer 120 is connected to the pulses final. The multiplexer 120 is used to receive the control signal, and under the control of the control signal, select to turn on the path between the first input terminal and the output terminal or the path between the second input terminal and the output terminals. It should be noted that the structure of the multiplexer 120 is not limited to the structure in the embodiment shown in the figure, and other multiplexers 120 that can realize the multiplexing function also belong to the protection scope of the present application.

Figure 12:
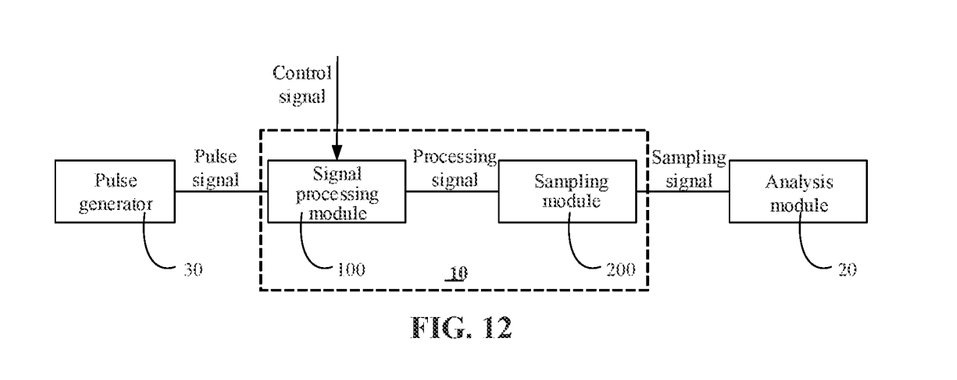
FIG. 12 is a schematic structural diagram of a test device according to an embodiment.

FIG. 12 is a schematic structural diagram of a test device according to an embodiment. Referring to FIG. 12, in this embodiment, the test device includes: the above-mentioned test circuit 10; an analysis module 20, which is connected to the sampling module 200 and is used to obtain the pulse width of the pulse signal according to the first sampling pulse and the second sampling pulse. The specific limitation of the test circuit 10 may refer to the above limitation, which will not be repeated here. In this embodiment, a test device with accurate pulse width test is realized by the test circuit 10 and the analysis module 20.

Figure 13:
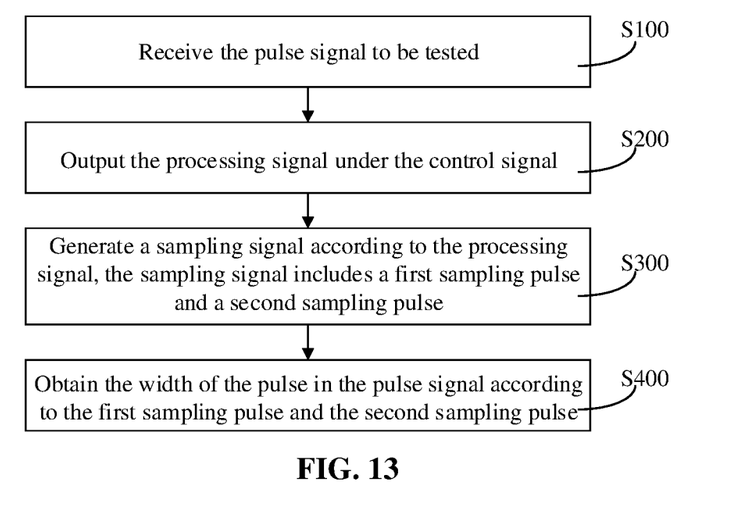
FIG. 13 is a flowchart of a test method according to an embodiment.

FIG. 13 is a flowchart of a test method of an embodiment. The test method of this embodiment is based on the above-mentioned test device. Referring to FIG. 13, in this embodiment, the method includes S100 to S400.

At S100, a pulse signal to be tested is received.

At S200, a processing signal is output under the control of a control signal.

At S300, a sampling signal is generated according to the processing signal, the sampling signal including a first sampling pulse and a second sampling pulse.

At S400, the pulse width of the pulse signal is obtained according to the first sampling pulse and the second sampling pulse.

It should be noted that the specific limitation on the test method may refer to the above limitation on the test device, which will not be repeated here. It should be understood that although the various steps in the flowchart of FIG. 13 are displayed in an order as indicated by the arrows, these steps are not necessarily performed in turn according to the order as indicated by the arrows. Unless specifically stated herein, the execution order of these steps is not strictly limited, and these steps can be executed in other orders. Moreover, at least part of the steps in FIG. 13 may include multiple sub-steps or multiple stages, these sub-steps or stages are not necessarily executed at the same moment, but can be executed at different moments, the execution of these sub-steps or stages is not necessarily performed sequentially, but may be performed in turn or alternatingly with at least part of other steps or sub-steps or stages of other steps.

The technical features of the above-mentioned embodiments can be combined arbitrarily, in order to make the description concise, all possible combinations of the various technical features in the above-mentioned embodiments are not described, however, as long as there is no contradiction in the combination of these technical features, it should be considered as the scope of this specification.

The above mentioned embodiments only express several implementation manners of the embodiments of the present application, and the description is relatively specific and detailed, but it should not be understood as a limitation on the scope of the disclosure. It should be noted that for those of ordinary skill in this art, without departing from the concept of the embodiments of the present application, several modifications and improvements can be made, and these all fall within the protection scope of the embodiments of the present application. Therefore, the scope of protection of the patent for the embodiments of this application shall be subject to the appended claims.

What is claimed is:

1. A test circuit, comprising:
a signal processing module, which is configured to receive a pulse signal to be tested and output a processing signal under control of a control signal;
a sampling module, which is connected to the signal processing, module and is configured to receive the processing signal and generate a sampling signal according to the processing signal; and
a control module, which is connected to the sampling module and the signal processing module respectively, and is configured to generate the control signal in response to the sampling signal, wherein an edge of the control signal corresponds to an edge of the sampling signal;
wherein the signal processing module comprises a first inverter and a multiplexer, wherein a first input terminal of the multiplexer is connected to an output terminal of the first inverter, a second input terminal of the multiplexer and an input terminal of the first inverter are respectively configured to receive the pulse signal, and the multiplexer is used to receive the control signal and select to turn on a first path between the first input terminal of the multiplexer and an output terminal of the multiplexer or a second path between the second input terminal of the multiplexer and the output terminal of the multiplexer under control of the control signal, and the output terminal of the multiplexer is used to output the processing signal;
wherein the sampling module comprises a first D trigger, a second inverter and a third inverter, a clock driving terminal of the first trigger is connected to the output terminal of the multiplexer, an input terminal of the second inverter is connected to an output terminal of the first D trigger, an output terminal of the second inverter is connected to an input terminal of the first D trigger, an input terminal of the third inverter is corrected to the output terminal of the second inverter, and an output terminal of the third inverter is configured to output the sampling signal;
wherein the control module comprises a second D trigger, a clock driving terminal of the second D trigger is connected to the output terminal of the third inverter, a input terminal of the second D trigger is configured to receive a preset level signal, an output terminal of the second D trigger is connected to the output terminal of the multiplexer, and the second U trigger is used to,
in response to the sampling signal, sample the preset level signal to generate the control signal.

2. The test circuit of claim 1, wherein the pulse signal comprises four pulses adjacent at time sequence, and the sampling signal comprises a first sampling pulse and a second sampling pulse; and
the signal processing module is configured to, in response to the control signal, invert a first pulse of the four pulses at time sequence in the pulse signal without inverting remaining pulses of the four pulses; and
the sampling module is configured to generate the first sampling pulse in response to first two pulses of the four pulses at timing sequence, and generate the second sampling pulse in response to last two pulses of the four pulses at timing sequence;
wherein the first sampling pulse and the second sampling pulse have a pulse width difference, and the pulse width difference is equal to a pulse width of the pulse signal.

3. The test circuit of claim 2, wherein the sampling module is configured to generate the first sampling pulse in response to different edges of the first two pulses at timing sequence, and generate the second sampling pulse in response to a same edge of the last two pulses at timing sequence.

4. A test method, based on the test circuit of claim 1, wherein the method comprising:
receiving the pulse signal to be tested;
outputting the processing signal under the control signal;
generating the sampling signal according to the processing signal, wherein the sampling signal comprises a first sampling pulse and a second sampling pulse; and
obtaining a pulse width of the pulse signal according to the first sampling pulse and the second sampling pulse;
wherein the first sampling pulse and the second sampling pulse have a pulse width difference, and the pulse width difference is equal to the pulse width of the pulse signal.

* * * * *